United States Patent [19]

Loeffler et al.

[11] 4,360,542

[45] Nov. 23, 1982

[54] PROCESS FOR THE PREPARATION OF THIN FILMS OF CADMIUM SULFIDE AND PRECURSOR SOLUTIONS OF CADMIUM AMMONIA THIOCYANATE COMPLEX USEFUL THEREIN

[75] Inventors: Otto E. Loeffler, Woodbridge, N.J.; Nirmal S. Jain, Irvington; Otto S. Kauder, New York, both of N.Y.

[73] Assignee: Argus Chemical Corporation, Brooklyn, N.Y.

[21] Appl. No.: 249,530

[22] Filed: Mar. 31, 1981

[51] Int. Cl.$^3$ .................. H01L 31/18; B05D 3/02
[52] U.S. Cl. ................................. 427/75; 427/76; 427/226
[58] Field of Search .................. 427/74, 75, 76, 226

[56] References Cited

U.S. PATENT DOCUMENTS

Re. 30,504  2/1981  Jordan et al. .................. 427/74 X
4,207,119   6/1980  Tyan ........................... 427/76 X
4,242,374  12/1980  Sansregret ..................... 427/74 X Primary Examiner—James R. Hoffman

[57] ABSTRACT

A process is provided for the preparation of thin films of cadmium sulfide by deposition of cadmium sulfide formed in the thermal decomposition of an aqueous solution of cadmium ammonia thiocyanate complex, useful particularly in the preparation of thin cadmium sulfide films on electrically-conductive substrates useful in photovoltaic cells, and on thermally-conductive substrates useful in solar energy absorbers, for energy conversion systems.

15 Claims, No Drawings

PROCESS FOR THE PREPARATION OF THIN FILMS OF CADMIUM SULFIDE AND PRECURSOR SOLUTIONS OF CADMIUM AMMONIA THIOCYANATE COMPLEX USEFUL THEREIN

Solar energy conversion has attracted particular interest in recent years because of the necessity to develop alternative energy sources. Photovoltaic cells or solar cells for electricity generation and solar energy absorbers for solar thermal energy conversion have accordingly been the subject of considerable investigation. Photovoltaic or solar cells function by converting light into electrical energy, while solar energy absorbers convert light into heat energy. However, a relatively high cost and low conversion efficiency of the available devices have limited their usefulness to applications where conversion efficiency and the amount of current generated are relatively insignificant economic factors.

With the development of silicon junction technology, it became possible to manufacture silicon junction photovoltaic cells having a relatively high conversion efficiency, but also a relatively high cost. Such devices have been used in space vehicles, but they are not practical for large-scale electricity generation in utility plants or manufacturing installations because of the high cost of preparing silicon crystals of the required purity, and the high manufacturing cost of such cells in comparison with their production capacity.

It has been known for some time that photovoltaic cells can be prepared by coating a thin film of cadmium sulfide on a hot sheet of Nesa glass or glass previously coated with tin oxide. Cadmium sulfide is however an extremely expensive chemical, as well as being rather toxic, and for economic reasons it is important to form the film of cadmium sulfide as thin as possible. It has been suggested (Moore *Solar Energy* 18, page 225 (1976)) that for a photovoltaic cell to be economically competitive, the individual semiconductive layers of the cell should not exceed 5 microns in thickness, assuming a conversion efficiency of at least 5%.

The deposition of cadmium sulfide films in such thin layers has posed difficulties. One problem is, that such thin cadmium sulfide films generally permit permeation by copper sulfide and copper when a layer of such material is formed on top of the cadmium sulfide layer, as must be done, since a photovoltaic cell requires an absorber-generator layer which is usually copper sulfide or copper, while the cadmium sulfide layer serves as the collector or convertor layer of the cell. Such permeation provides short circuits between the copper sulfide layer and the substrate, which renders the cell inoperative.

One way of producing thin cadmium sulfide films is by thermal evaporation and sputtering. These techniques are however prohibitively expensive, and could not be used to produce thin films in large quantities.

Another technique, which is considerably less expensive, is described in U.S. Pat. No. 4,159,914 patented July 3, 1979 to John F. Jordan and Curtis M. Lampkin, and consists in spraying a solution which forms cadmium sulfide on the substrate, the spray being intermittent, and covering only a small portion of the substrate at a given point in time, while the surface of the substrate is maintained at a uniform and constant elevated temperature of from 230° to 600° C. The solution comprises a soluble cadmium salt and a soluble sulfide or thiourea. Cadmium sulfide is thus formed by a double decomposition reaction in situ on the substrate.

Another spraying technique is described in U.S. Pat. No. 4,242,374 patented Dec. 30, 1980 to Sansregret, and involves the chemical spray deposition of an oxide film of cadmium, followed by treatment of the oxide film with hydrogen sulfide, reactive therewith to produce cadmium sulfide. The cadmium oxide film is obtained by spray deposition and thermal decomposition of a soluble cadmium salt, such as cadmium nitrate, cadmium oxalate, or cadmium acetate.

U.S. Pat. No. 4,207,119 patented Jan. 10, 1980 to Tyan prepares a cadmium sulfide/cadmium telluride solar cell, first laying down a cadmium sulfide layer on a Nesatron glass substrate by vapor deposition at a temperature of about 550° C. in an oxygen-containing atmosphere of about 0.4 torr $O_2$ to a thickness of 0.2 micron, according to Example 1, with variations described in succeeding Examples. A cadmium telluride layer is then laid down on top of the cadmium sulfide layer.

All of these processes are complicated, and difficult to control. A double decomposition condensation, or similar reaction of two chemicals in situ to produce one or several different chemicals, depends upon relative proportions of the chemicals, their concentrations, the reaction temperature and the reaction time.

In accordance with the present invention, a process for the deposition of cadmium sulfide in thin films is provided which proceeds by way of thermal decomposition of a cadmium ammonia thiocyanate complex in aqueous ammonia solution. Since the complex is thermally unstable, and the reaction is a thermal decomposition, only one chemical, the complex, is needed. There is no interreaction of two or more reagents, as in a double decomposition reaction, and therefore no need to provide combining proportions, or to take account of reaction rates. Moreover, since the cadmium sulfide removes itself from the reaction milieu by deposition, the decomposition can be carried to completion, and there are no solid or liquid byproducts or unreacted starting materials that have to be removed at the conclusion of the deposition. Hydrogen sulfide, water and ammonia are volatile, and leave no residue. Moreover, the process is readily carried out at moderately elevated temperatures, since the decomposition of the complex proceeds at a temperature within the range from about 65° to about 300° C. The process is accordingly economical, and easily controlled to ensure uniform and reproducible deposition of a thin cadmium sulfide film by appropriate selection of the usual process parameters of temperature, concentration and time.

Cadmium ion is known to form a cadmium ammonia complex $Cd(NH_3)_2^{++}$.

The thermally unstable complex of cadmium ammonia thiocyanate is of unknown structure, and contains unknown combining proportions of cadmium, ammonia and thiocyanate. While crystalline materials have been isolated from a solution of the cadmium ammonia thiocyanate complex, the crystals are not of uniform composition, and do not correspond to the combining proportions of cadmium, ammonia and thiocyanate, that would be expected to satisfy the valence of $Cd(NH_3)_2^{++}$, i.e., $Cd(NH_3)_2(SCN)_2$, but rather to a mixture with an $NH_3:SCN$ molar ratio of 2:1, suggesting a mixture of $Cd(NH_2)_2^{++}$ and $Cd(NH_3)_2(SCN)_2$, or a complex of different structure, with $NH_3$ and $SCN$ in the complex. Nonetheless, cadmium ammonia thiocyanate complexes having varying proportions of cadmium, ammonia and thiocyanate all give uniform and satisfactory cadmium sulfide films upon thermal decomposition at temperatures within the range stated. Therefore, it appears that a fixed molecular or atomic composition of the complex is not required, to obtain the advantages of the process of the invention.

The cadmium ammonia thiocyanate complex can be prepared quite directly and simply, by mixing an aqueous cadmium thiocyanate solution and aqueous ammonium hydroxide in proportions to bring the solution pH to within the range from about 8 to about 10, preferably from about 8.4 to about 9.6. The pH is dependent upon the proportion of ammonia present, and it appears that the more ammonia present, up to a molar ratio $NH_3$:SCN of 2:1, the more reactive the complex is, and the more rapidly the cadmium sulfide is deposited.

An easy way for preparing the cadmium ammonia thiocyanate complex of the invention economically and in commercial quantities, starting from relatively inexpensive and available starting materials, is by the reaction of aqueous ammonium thiocyanate solution with cadmium oxide. The cadmium oxide in solid particulate form can be added to the aqueous ammonium thiocyanate solution at room temperature, or, if desired, by heating at a temperature up to about 100° C. As the reaction proceeds, the cadmium oxide dissolves, because the reaction product, cadmium ammonia thiocyanate complex, is water-soluble. The pH also rises, from approximately pH 5.5 for aqueous ammonium thiocyanate solution to within the pH range stated above, resulting from the cadmium ammonia thiocyanate complex.

The molar ratio of ammonia $NH_3$ to thiocyanate SCN in the cadmium ammonia thiocyanate complex solution depends on the amount of added ammonia, and on the ratio of thiocyanate to cadmium. It is convenient, but not necessary, to use a moderate excess of thiocyanate, to ensure that all the camium oxide is converted. In Examples B through G, below, an about 50% excess of thiocyanate was present. If no ammonia is added, there would be present as a result of the conversion of cadmium oxide, two moles of ammonia per mole of CdO, less a small quantity that escapes as a gas, estimated as 0.01 to 0.02 mole per mole of CdO. The ratio of ammonia to thiocyanate is then $1/1+0.01x$, where x is the percent excess thiocyanate, before counting in added ammonia. Thus, in Example B the molar ratio of ammonia to thiocyanate is 0.67:1 before the addition of ammonia and 1.3:1 in the final composition.

Accordingly, the molar ratio $NH_3$:SCN is within the range from about 0.5 to about 2, with a preferred range of about 1.1:1 to about 1.5:1. Addition of more ammonium hydroxide, to an excess up to about 20%, raises the pH to a maximum of about 10.5.

It is customary for special effects to "dope" a cadmium sulfide layer with other metals, referred to as impurity metals, such as zinc. Hydrochloric acid is also included to increase the voltage output of the cell. This is quite easy to do, in the process of the invention, by codeposition with the cadmium sulfide of a chloride or sulfide of the impurity metal from the cadmium ammonia thiocyanate complex solution. Zinc, nickel, cobalt, copper and iron are particularly easy metals with which to "dope" the cadmium sulfide layer because they also form water-soluble complexes with ammonia, as well as insoluble sulfides, and therefore readily coprecipitate with cadmium sulfide when the solution is heated.

Such impurity metals can be included in the complex solution simply by starting the preparation with not only cadmium oxide but also the oxide of the impurity metal, such as zinc oxide, nickelous oxide, cobaltous oxide, or ferrous oxide, or the corresponding -ic oxides. These oxides will dissolve with the cadmium oxide in forming a soluble ammonia complex of the metal. Chloride can also be added, as a chloride of one of the metals present, or as ammonium chloride.

A sulfur analogue such as selenium or tellurium can also be incorporated in the cadmium ammonium thiocyanate complex solution. In the presence of selenocyanate, cadmium selenide is deposited with the cadmium sulfide, and in the presence of tellurocyanate, cadmium telluride is deposited. These cadmium selenide and telluride modifiers can be used in minor amounts, up to about 25% of the cadmium sulfide, and added as ammonium selenocyanate and ammonium tellurocyanate.

The following Example is illustrative of the preparation of cadmium ammonia thiocyanate complex of the invention:

EXAMPLE A

An aqueous solution of ammonium thiocyanate was formed containing 33% ammonium thiocyanate and having a pH of 5.5 To this solution was added particulate cadmium oxide at about 25° C., in the proportion of one mole cadmium oxide to two moles ammonium thiocyanate. Within about a half hour, the cadmium oxide had all dissolved, and the pH of the solution had risen to 8.6.

Evaporation of this solution at 40° C. resulted in the precipitation of a white crystalline material analyzing 45.1 and 46.4% by weight cadmium, in duplicate determinations by atomic absorption, and 43.2 and 43.2% SCN, by titration with silver nitrate in duplicate. The theoretical analysis for cadmium thiocyanate $Cd(SCN)_2$ is 49.1% Cd and 50.1% SCN, while that for the cadmium ammonia thiocyanate complex $Cd(NH_3)_2(SCN)_2$ is 42.7% Cd and 44.3% SCN, showing the crystals are neither, but perhaps a mixture thereof, and perhaps a complex of unknown structure with two SCN for each $NH_3$.

Continued heating of the crystalline material at 100° C. resulted in formation of CdS, with liberation of ammonia and hydrogen sulfide.

EXAMPLE B

Ammonium thiocyanate (crystals, 4136 g, chloride impurity content 50 mg/kg) was dissolved in 11.5 liters of demineralized water (chloride impurity content below 0.1 mg/l) and 2262 g cadmium oxide was added, with stirring. After all but a few specks of the oxide had dissolved, 2000 g of aqueous ammonium hydroxide (2.2% Cl) was added, and the solution filtered. The resulting solution of cadmium ammonia thiocyanate complex had a specific gravity of 1.142 at 25° C., and contained 10.8% cadmium. The pH was 9.1, and the molar ratio $NH_3$:SCN was 1.31:1. The final content of chloride impurity, calculated from the retention of all chloride introduced in the product, was 20 mg/kg.

Evaporation of this solution at 100° C. resulted in the precipitation of a white crystalline material determined to be cadmium sulfide, with liberation of ammonia and hydrogen sulfide.

EXAMPLES C TO G

An aqueous solution of ammonium thiocyanate was formed containing 33% ammonium thiocyanate and having a pH of 5.5. To this solution was added particulate cadmium oxide at about 25° C., in the proportion of one mole cadmium oxide to two moles ammonium thiocyanate. Within about a half hour, the cadmium oxide had all dissolved, and the pH of the solution had risen to 8.6.

Modified cadmium ammonia thiocyanate complex solutions were then prepared from portions of this solution by adding the materials indicated below:

| Example No. | Additive | Amount (grams) | Modifier | Amount (mg/kg of solution) |
|---|---|---|---|---|
| C | Zinc Oxide | 4.5 | Zinc | 180 |
| D | Ammonium selenocyanate | 1.55 | Selenium | 50 |
| E | Ammonium selenocyanate | 31.0 | Selenium | 1000 |
| F | Ammonium chloride | 6.0 | Chloride | 220 |
| G | Cuprammonium hydroxide (5% Cu) | 29.85 | Copper | 75 |

Evaporation of these solutions at 100° C. resulted in the precipitation of a crystalline material determined to be cadmium sulfide, in admixture with zinc sulfide, in Example C, with copper sulfide in Example G, with chloride in Example F, and with cadmium selenide in Examples D and E.

Prior to deposition of cadmium sulfide, solutions as prepared in any of Examples A through G are conveniently diluted to a cadmium content of 0.5 to 2% by weight, typically 1.1%.

A photovoltaic or solar cell generally has four layers;
(1) an absorber generator layer;
(2) a collector converter layer;
(3) a transparent electrical contact layer; and
(4) an opaque electrical contact layer.

The absorption of light energy by the absorber generator generates by way of the collector converter a voltage differential between the transparent and the opaque electrical contacts, and an electric current which is proportional to the intensity of the light.

As the absorber generator layer, copper sulfide or copper is generally used, but copper indium selenide and copper indium sulfide can also be used, as well as stannous cupric sulfide, and other types of absorbers compatible with copper oxide, such as zinc phosphide and amorphous silicon.

The collector converter layer is the cadmium sulfide layer formed by deposition in accordance with the invention, and since the collector is of a different semiconductor from the absorber, the device is a heterojunction.

The transparent contact is made of an electrically conductive material which permits light to pass through to the absorber. It can be either a continuous transparent sheet of conductive material, or an open grid of opaque conductive material. Transparent conductive materials which can be used include glass, quartz and sapphire. Grids of opaque electrically-conductive material can be made of any electrically-conductive metal, such as gold, silver, copper, nickel, tin, platinum, palladium, chromium, iridium and rhodium, and also nonmetallic materials such as copper sulfide and copper telluride having a high electrical conductivity.

The following Example illustrates the preparation of a photovoltaic cell in accordance with the invention:

EXAMPLE 1

An opaque electrical contact used as a substrate in the process is prepared by cleaning a copper foil electrolytically and by immersion in sulfuric acid, and then depositing a thin layer of zinc on the cleaned surface by electroplating.

A blocking layer is then formed on the cleaned surface to prevent shorts between the transparent contact and the opaque contact of the cell. A suitable blocking layer is zinc sulfide, and this is formed on the foil surface by vacuum evaporating or chemically precipitating a thin layer of 0.5 to 2 micron thickness of zinc sulfide.

Next, the collector converter layer is deposited, cadmium sulfide. This is deposited by applying an aqueous solution of cadmium ammonia thiocyanate complex to the zinc sulfide layer, heating at 90° C. until a thin layer of cadmium sulfide is formed, and the water and ammonia are driven off. The collector surface is then textured by etching in hydrochloric acid, using a two to four second dip in a 55% volume by volume concentration of hydrogen chloride at 60° C.

Next, an absorber generator layer is formed on the collector layer, as a junction between the absorber and the collector. A layer of cuprous sulfide is formed on the cadmium sulfide layer by an ion exchange process from an aqueous solution of cuprous chloride, by way of a ten second dip of the composite in a bath composition composed of 24 g cuprous chloride and 8 g sodium chloride in 4 liters of water, with sufficient hydrochloric acid to bring the pH to within the range from 2 to 3. The resulting composite is heated at 90° to 100° C. until a cuprous sulfide layer is formed.

Next, any cadmium sulfide not covered by the cuprous sulfide layer is removed by conversion into a cadmium sulfate blocking layer, by heat-treating in an oxygen atmosphere, such as air, at 200° C. for two minutes.

The structure is then heat-treated in a reducing atmosphere to complete the formation of a junction between the cadmium sulfate and the cuprous sulfide, and to take the cuprous sulfide to its desired stoichiometric condition. A ten-hour heating in a 90% argon, 10% hydrogen atmosphere at 170° C. is used, during the course of which heat treatment cuprous sulfide diffuses into the cadmium sulfide, and dopes it in the interfacial region. In addition, oxides such as cuprous oxides that form on the free surface of the cuprous sulfide layer are reduced, without completely reducing the cadmium sulfate layer.

Next, a thin layer of cuprous oxide is applied, first applying a thin layer of copper approximately 10 to 15 Angstroms thick on the cuprous sulfide by vacuum evaporation, and then heating the resulting structure in air at 200° C. for ten minutes. Then, sufficient additional cuprous oxide is deposited by standard vacuum evaporation or sputtering techniques to produce a cuprous oxide layer having a total thickness between 100 and 10,000 Angstroms. This draws some copper atoms from the copper plating layer into the cuprous sulfide, assuring optimum stoichiometry.

The transparent contact in the form of a grid is applied to the cuprous oxide coated surface by printing through a suitable mask. As the metal there can be used gold, silver, copper, nickel, tin, platinum, pallatium, chromium, iridium, or rhodium.

The above is merely an illustrative Example. Other variations of photovoltaic cells in which a cadmium sulfide layer serves as the collector converter layer can also be used, as will be apparent to those skilled in the art.

For application as a solar energy absorber for solar thermal energy conversion systems, the aqueous cadmium ammonia thiocyanate solution would be applied to a thermally conductive substrate, preferably one having a softening temperature above about 475° C. Photothermal applications require only that the cadmium sulfide film satisfy thermal conduction and thermal integrity criteria.

In the case of both photovoltaic and thermal cells, thermal decomposition of the cadmium ammonia thiocyanate complex after application to the substrate is accomplished by holding the substrate at a temperature within the range from about 65° to about 300° C., and preferably from about 100° to about 200° C. for from fifteen minutes to two hours. This can be achieved by application of heat as in an oven, or in other conventional ways.

The cadmium ammonia thiocyanate complex solution can be applied to the substrate using any applicable procedure, such as by spraying, coating, misting, brushing, or flowing the solution onto the substrate.

The decomposition of the cadmium ammonia thiocyanate to form and deposit cadmium sulfide, together with evaporation of the volatile materials from the substrate, is usually complete within about fifteen minutes to about two hours, depending upon the temperature selected. To avoid damage to the substrate, it normally is desirable to carry out the decomposition as rapidly as possible, and thus preferably the heating time is within the range from about thirty minutes to about one hour.

In accordance with the foregoing disclosure, the following is claimed as the inventive and patentable embodiments thereof:

1. A process for the deposition of cadmium sulfide in thin films on a substrate, which comprises applying to the substrate a cadmium ammonia thiocyanate complex in solution in aqueous ammonium hydroxide; heating the complex at a temperature at which the complex undergoes thermal decomposition to form cadmium sulfide; depositing the cadmium sulfide on the substrate; and removing volatile reaction products, water and ammonia.

2. A process according to claim 1 in which the decomposition of the complex is carried out by heating at a temperature within the range from about 65° to about 300° C.

3. A process according to claim 1, in which the $NH_3$:SCN molar ratio in the complex solution is within the range from about 0.5:1 to about 2:1.

4. A process according to claim 1 in which the heating is carried out by applying heat to the substrate.

5. A process according to claim 1 in which the cadmium ammonia thiocyanate complex solution comprises selenocyanate that deposits cadmium selenide.

6. A process according to claim 1 in which the cadmium ammonia thiocyanate complex solution comprises an impurity metal also forming an ammonia complex and deposited as metal sulfide with the cadmium sulfide.

7. A process according to claim 1 in which the solution of cadmium ammonia thiocyanate complex has a pH within the range from about 8 to about 10.

8. A process according to claim 1 in which the cadmium content of the solution is within the range from about 0.5 to about 10% by weight.

9. A process according to claim 8 in which the cadmium content is about 1% by weight.

10. A process according to claim 1 in which the cadmium ammonia thiocyanate complex has a ratio $NH_3$:SCN within the range from about 1.1:1 to about 1.5:1.

11. A process according to claim 10 in which the pH of the solution is within the range from about 8.4 to about 9.6.

12. In a method for fabricating a photovoltaic device comprising the steps of providing a first electrical contact, depositing a layer of collector material on said first electrical contact, depositing a layer of absorber material on said collector to form a junction therebetween, and applying a second electrical contact to said absorber, the improvement which comprises applying as the collector material on the substrate a cadmium ammonia thiocyanate complex in solution in aqueous ammonium hydroxide; heating the complex at a temperature at which the complex undergoes thermal decomposition to form cadmium sulfide; depositing the cadmium sulfide on the substrate; and removing volatile reaction products, water and ammonia.

13. The improved method of claim 12 wherein said absorber is deposited on said collector by depositing a layer of a copper-bearing absorber material on said collector.

14. The improved method of claim 12 wherein said absorber is deposited on said collector by depositing a layer of selenocyanate that deposits cadmium selenide.

15. The improved method of claim 12 wherein said absorber is deposited on said collector by depositing a layer of an impurity metal also forming an ammonia complex and deposited as metal sulfide with the cadmium sulfide.

* * * * *

UNITED STATES PATENT AND TRADEMARK OFFICE
CERTIFICATE OF CORRECTION

PATENT NO. : 4,360,542
DATED : November 23, 1982
INVENTOR(S) : Otto E. Loeffler et al It is certified that error appears in the above-identified patent and that said Letters Patent are hereby corrected as shown below:

Column 2, line 66 : "$Cd(NH_2)_2^{++}$" should be --$Cd(NH_3)_2^{++}$--

Signed and Sealed this

Ninth Day of December, 1986

Attest:

DONALD J. QUIGG

Attesting Officer      Commissioner of Patents and Trademarks